(12) United States Patent
Hille

(10) Patent No.: US 10,213,352 B2
(45) Date of Patent: Feb. 26, 2019

(54) HAND-HELD CONTROL FOR AN ELECTROMOTIVE FURNITURE DRIVE, METHOD FOR DETECTING ACTUATION OF A HAND-HELD CONTROL, AND ELECTROMOTIVE FURNITURE DRIVE

(71) Applicant: DEWERTOKIN GMBH, Kirchlengern (DE)

(72) Inventor: Armin Hille, Bielefeld (DE)

(73) Assignee: DewertOkin GmbH, Kirchlengern (DE)

( * ) Notice: Subject to any disclaimer, the term of this patent is extended or adjusted under 35 U.S.C. 154(b) by 402 days.

(21) Appl. No.: 14/890,067

(22) PCT Filed: May 12, 2014

(86) PCT No.: PCT/EP2014/059665
§ 371 (c)(1),
(2) Date: Nov. 9, 2015

(87) PCT Pub. No.: WO2014/180998
PCT Pub. Date: Nov. 13, 2014

(65) Prior Publication Data
US 2016/0081866 A1    Mar. 24, 2016

(30) Foreign Application Priority Data

May 10, 2013  (DE) .................. 10 2013 104 827

(51) Int. Cl.
*A47C 31/00* (2006.01)
*A61G 7/018* (2006.01)
(Continued)

(52) U.S. Cl.
CPC .............. *A61G 7/018* (2013.01); *A47C 1/022* (2013.01); *A47C 20/04* (2013.01); *A47C 20/041* (2013.01);
(Continued)

(58) Field of Classification Search
CPC ..................................................... A47C 31/008
(Continued)

(56) References Cited

U.S. PATENT DOCUMENTS 4,959,810 A * 9/1990 Darbee .................. G08C 19/28
340/12.22
5,568,367 A * 10/1996 Park ..................... H01H 9/0235
200/314
(Continued)

FOREIGN PATENT DOCUMENTS

DE           9414086       1/1995
DE         29722179 U1     5/1998
WO    WO 2012/061406 A2   5/2012

OTHER PUBLICATIONS

International Search Report issued by the European Patent Office in International Application PCT/EP2014/059665.

*Primary Examiner* — Son Mai
(74) *Attorney, Agent, or Firm* — Henry M. Feiereisen LLC

(57) ABSTRACT

Disclosed is a hand-held control (1) for furniture drives (81), comprising a touch-sensitive control panel section (3, 3a, 3b) that has a number of actuation surfaces (4). A method for detecting actuation of the hand-held control (1) is also provided. An electromotive furniture drive (81) is fitted with a hand-held control (1) of this type.

6 Claims, 14 Drawing Sheets

(51) Int. Cl.
*A47C 20/04* (2006.01)
*A47C 1/022* (2006.01)
*G05B 15/02* (2006.01)
*H03K 17/96* (2006.01)

(52) U.S. Cl.
CPC ............ *A47C 31/008* (2013.01); *G05B 15/02* (2013.01); *H03K 17/9622* (2013.01); *H03K 2217/960785* (2013.01)

(58) Field of Classification Search
USPC ........................................................ 700/275
See application file for complete search history.

(56) References Cited

U.S. PATENT DOCUMENTS

| | | | | |
|---|---|---|---|---|
| 6,008,598 A * | 12/1999 | Luff | ............ | A47C 31/008 318/16 |
| 7,319,426 B2 * | 1/2008 | Garfio | ............ | H01H 9/0235 341/173 |
| 7,345,592 B2 * | 3/2008 | Rogers | ............ | H04B 1/202 340/12.55 |
| 7,999,795 B2 * | 8/2011 | Hamblin | ............ | G06F 3/0416 178/18.01 |
| 8,248,183 B2 * | 8/2012 | Syal | ............ | H01P 5/028 333/238 |
| 8,446,386 B2 * | 5/2013 | Hamblin | ............ | G06F 3/0416 178/18.01 |
| 8,497,844 B2 * | 7/2013 | Chen | ............ | G06F 3/044 341/33 |
| 8,573,984 B2 * | 11/2013 | Miller | ............ | G06F 3/044 439/67 |
| 8,909,357 B2 * | 12/2014 | Rawls-Meehan | ............ | A47C 20/041 700/17 |
| 8,926,535 B2 * | 1/2015 | Rawls-Meehan | ............ | A47C 20/041 5/617 |
| 8,981,679 B2 | 3/2015 | Hille | | |
| 2003/0195644 A1 | 10/2003 | Borders et al. | | |
| 2009/0273570 A1 * | 11/2009 | Degner | ............ | G06F 3/044 345/173 |
| 2010/0292945 A1 | 11/2010 | Reynolds et al. | | |
| 2011/0156930 A1 | 6/2011 | Chen et al. | | |
| 2012/0118718 A1 | 5/2012 | Geiger et al. | | |
| 2012/0194106 A1 | 8/2012 | Hille | | |
| 2014/0152068 A1 | 6/2014 | Hille | | |
| 2014/0159618 A1 | 6/2014 | Hille | | |
| 2015/0019020 A1 | 1/2015 | Hille | | |
| 2015/0025688 A1 | 1/2015 | Hille et al. | | |
| 2015/0054429 A1 | 2/2015 | Hille et al. | | |
| 2015/0241857 A1 | 8/2015 | Hille | | |

* cited by examiner

HAND-HELD CONTROL FOR AN ELECTROMOTIVE FURNITURE DRIVE, METHOD FOR DETECTING ACTUATION OF A HAND-HELD CONTROL, AND ELECTROMOTIVE FURNITURE DRIVE

CROSS REFERENCE TO RELATED APPLICATIONS

This application is the U.S. National Stage of International Application No. PCT/EP2014/059665, filed May 12, 2014, which designated the United States and has been published as International Publication No. WO 2014/180998 and which claims the priority of German Patent Application, Serial No. 10 2013 104 827.7, filed May 10, 2013, pursuant to 35 U.S.C. 119(a)-(d).

BACKGROUND OF INVENTION

The invention relates to a hand-held control for an electromotive furniture drive. The invention further relates to a method for detecting an actuation of a hand-held control as well as to an electromotive furniture drive.

Such hand-held controls are used, for example, for controlling electromotive furniture drives for adjustment of furniture such as, for example, beds, armchairs and similar.

Such an electromotive furniture drive is mounted in an item of furniture that has fixed and movable furniture components. Fixed furniture components are, for example, frame structural elements. Movable furniture parts are, for example, fixed or spring-resilient supporting surfaces of an upholstery or a mattress of the sitting and/or lying furniture or load-bearing struts for receiving the supporting surfaces.

The electromotive furniture drive is used for adjustment of the movable furniture components. In this case, the adjusting movement and drive force produced by the electromotive furniture drive is transferred to the respective movable furniture part, where the electromotive furniture drive is supported on a fixed furniture component and adjusts the movable furniture component relative to the fixed furniture component. The electromotive furniture drive can also be attached between two movable furniture components where it can adjust these relative to one another.

Wired and also wireless hand-held controls are known. Some wireless hand-held controls have an infrared transmission path or a radio transmission path. Other hand-held controls have a housing and control interfaces that are configured as push switches or as a touchscreen.

DE 297 22 179 discloses a hand switch with a touchscreen as control interface. It has proved to be a disadvantage that the evaluation of this resistive touchscreen is relatively complex.

DE 94 14 086 discloses a hand-held control with push buttons that have a mechanical actuating effect on microswitches inside the housing of the hand-held control. For design reasons the protruding and mechanically movable push buttons have provided a disadvantage of this prior art.

Electromotive furniture drives are known from the prior art in a multiplicity of different designs for different applications and purposes.

For this reason in some cases a transition has been made to using film switches or flat snap-action switches. However, there are requirements where haptic depression and actuation by film switches is not desirable. Furthermore, the illumination of these and the switches mentioned initially is difficult and associated with an increased expenditure on components.

Electromotive furniture drives are used in many different designs, e.g. as single drives, double and multiple drives.

SUMMARY OF THE INVENTION

The invention is based on the object of providing an improved hand-held control that no longer has the disadvantages mentioned initially.

A further object of the invention is to provide an improved method for detecting an actuation of a hand-held control.

Yet another object consists in providing an improved electromotive furniture drive.

According to one aspect of the invention, a hand-held control includes at least one control panel section, wherein the at least one control panel section includes at least one actuation surface, wherein the at least one actuation surface cooperates with at least one detector.

According to another aspect of the invention, a method for detecting an actuation of a hand-held control includes the process steps of applying an electric periodic test signal from at least one evaluation unit to at least one sensor surface of at least one detector, recording a response signal by means of a test signal modified by actuation of the at least one detector, and evaluating the test signal thus obtained and producing a logic switching signal for detecting the actuation of the hand-held control.

According to yet another aspect of the invention, an electromotive furniture drive for adjustment of movable components of an item of furniture includes at least one hand-held control as set forth above, wherein an actuation of the hand-held control is detected by a method as set forth above.

A hand-held control is provided with a control panel section, where the control panel section has a firm non-resilient surface and the control panel section has touch-sensitive actuation surfaces that are arranged at a predetermined distance from one another and each actuation surface is connected to at least one detector.

Accordingly, a hand-held control according to the invention for electromotive furniture drives comprises at least one control panel section, wherein the at least one control panel section comprises at least one actuation surface, wherein the at least one actuation surface cooperates with at least one detector.

A method according to the invention for detecting an actuation of such a hand-held control has the following process steps. (V1) Applying an electric periodic test signal from at least one evaluation unit to at least one sensor surface of at least one detector; (V2) recording a response signal by means of a test signal modified by actuation of the at least one detector; and (V3) evaluating the test signal thus obtained and producing a logic switching signal for detecting the actuation of the hand-held control.

The function is conceivably simple and as follows:

if a finger approaches an actuation surface to trigger a switching function or a finger touches an actuation surface, this is detected by the detector as a capacitive change of the actuation surface relative to a reference value so that the associated evaluation unit generates a switching signal for an intended function, e.g. an adjustment of an electromotive furniture drive.

Accordingly, an electromotive furniture drive is fitted with at least one hand-held control described above for control, where an actuation surface of the hand-held control is accomplished by the method described above.

In a first embodiment, each actuation surface is assigned a detector that is disposed inside the housing of the hand-held control. A detector is to be understood as a detecting device that detects an approach or/and touching of a finger of a human hand in cooperation with the actuation surface and in so doing outputs an electric signal.

In a further embodiment, each actuation surface is assigned a number of detectors that are arranged inside the housing of the hand-held control.

Thus, the at least one control panel section comprises a plurality of actuation surfaces that are arranged at a predetermined distance from one another.

In a further embodiment, the at least one actuation surface cooperates with the at least one detector so that the at least one actuation surface has at least one touch-sensitive function. Thus, the detector can, for example, be configured as a capacitive proximity detector.

In another embodiment, the detector is configured as a capacitive proximity switch.

it is further provided that the at least one control panel section has a firm, non-resilient surface. As a result, it is possible that different surfaces can be used.

In this case, the surface of the hand-held control can advantageously itself comprise the at least one control panel section.

The actuation surfaces act like button actuators, i.e. actuators of electric buttons but the surface of the control panel is non-resilient and has no springy sections.

Those sections are defined as non-resilient surface sections or as non-springy sections, which have no identifiable resilient property within the framework of the use of the hand-held control as intended. During a use of the hand-held control as intended, the actuation surfaces are either touched or alternatively touched or acted upon with a finger pressure having a force application of up to 10 Newtons. An approximate touching can also be understood as a further form of touching when the identification of a finger approaching the actuation surface is already made at a distance of a few tenths of millimetres.

A detector can furthermore be configured as an integrated circuit (IC).

A detector can alternatively be configured as an electrical conductor that is connected in an electrically conducting manner to an evaluation unit, for example, in the form of an integrated circuit. Naturally, optical transmission, e.g. light guides, are also possible.

Alternatively a detector can comprise a plurality of electrical conductors. Other detectors comprise two electrical conductors. Again, other detectors comprise at least one electrical conductor, wherein at least one first conductor guides the touch-sensitive detection signal to the evaluation unit and at least one further conductor is assigned to the first conductor. Furthermore, a plurality of detectors can comprise one or more common conductors. Alternatively, pluralities of detectors can be combined into groups if they have a common conductor for connection to the evaluation unit or alternatively a further common conductor. The further common conductor can serve as reference or as reference encoder, as will be explained in detail below.

In a further embodiment, the hand-held control has a detector printed circuit board with at least one detector. Such a printed circuit board can be produced cost-effectively and can be adapted to many different housings.

In this case, it is provided that the at least one detector comprises at least one sensor surface to which is assigned at least one ground plane. Advantageously both the sensor surface and also the ground plane can be constructed as conductors of the printed circuit board.

The at least one sensor surface can be configured as a rectangular, in particular square, electrically conducting frame. Naturally, other shapes are also possible. These shapes have already proved successful in experiments and can be easily implemented.

In yet another embodiment, it is provided that the at least one sensor surface with the at least one associated ground plane is connected in an electrically conducting manner to at least one evaluation unit.

The evaluation unit can be a microprocessor that produces switching and control signals for a transmission path. By means of the transmission path the hand-held control is connected to the furniture and/or to the furniture drive. The transmission path is preferably configured as a wireless radio link and alternatively as a wired cable connection.

At least one detector is assigned a reference encoder. Such a reference encoder can advantageously be the at least one ground plane. Alternatively the housing comprises a reference device. This can be configured as a conductor. Alternatively the reference device can be attached to the surface of the hand-held control or furthermore be inserted seamlessly in the surface. A further alternative provides a reference device at the positions of the hand-held control, which are usually touched by the fingers or sections of the hand when holding in the hand.

In addition, a light, e.g. an LED can be provided, whereby the hand-held control also acquires a flashlight function.

In a particularly advantageous embodiment, further illuminants, for example, configured as LEDs, are provided to illuminate at least one actuation surface. Switching on the illuminant is accomplished in various ways but at least upon actuation of an actuation surface. For this purpose, the evaluation unit has a switch output for triggering or for switching the illuminant. Alternatively, a further actuation surface is provided on the housing circumference of the hand-held control, which is provided for triggering the switch command for switching on the illuminant. Other embodiments have a specifically characterized actuation surface at least for switching on the illuminant. Other embodiments have another switch or detector that identifies the grasping of the hand-held control and is configured for example as a vibration sensor or as an acceleration sensor that identifies the signal for switching on the illuminant.

One embodiment of the hand-held control has a symbol that can be identified in daylight or other identifications of the actuation surfaces. Furthermore, the hand-held control can be fitted with a light-sensitive sensor that prevents the switching on of the illuminant when there is sufficient ambient lighting when a battery-operated hand-held control is involved.

A further embodiment of the hand-held control comprises symbols or other identifications of the actuation surfaces that can only be identified when switching on the illuminants. A further embodiment of a hand-held control has a predetermined number of symbols or other identifications of the number of predetermined actuation surfaces when these are only to appear or be used in special operating modes. Consequently, further actuation surfaces can be faded in in a very simple manner when these are to be used, for example, for programming height or angular adjustment positions of the furniture or for programming the time or similar. Consequently, the operating comfort is increased significantly in a simple manner if the user can concentrate only on the most important control interfaces.

The arrangement of the illuminant is in particular provided inside the hand-held control. The front side or the operating side is in this case configured to be translucent.

To this end, the at least one sensor surface can have a through hole that at least partially surrounds it. This is a compact and space-saving structure.

Alternatively, only the operating surfaces are configured to be translucent. Another embodiment provides illuminants that are apparently inserted in the front side or in the operating side. To this end, the illuminants are attached to the surface of the front side. In an advantageous configuration, they are arranged on the inner side of the front side. Furthermore, an actuation surface itself can also comprise the illuminant if it forms a unit with the actuation surface and is either attached to the actuation surface or is in close spatial communication with this. Furthermore, the symbol itself can be configured as illuminant.

Yet another embodiment of the hand-held control provides that the at least one sensor surface is at least partially completely surrounded by the at least one ground plane. Such a complete surrounding can include all sides of the sensor surface, even from the other printed circuit board side. A reference surface is advantageously simply created in this case.

Furthermore, the at least one ground plane comprises at least one cross pattern surrounded by an edge. It has been found here by means of many experiments that by this means any influence of various interferences can surprisingly be reduced.

In yet another embodiment, the hand-held control comprises at least one control device for generating a control signal. The control device can also take over additional evaluation tasks of the response signals, whereby an interference immunity can be increased.

In one embodiment of the method according to the invention, in the third process step (V3) evaluation from the response signal, a logic switching signal is formed directly. As a result, additional evaluation routines can be saved. On the other hand however it is possible to use this switching signal thus formed to increase the operating safety for other evaluation processes.

In one variant in the third process step (V3) evaluation, the at least one evaluation unit compares all the response signals, wherein the response signal having the highest signal level is used for relaying to a control device of the hand-held control.

Alternatively or additionally, in the third process step (V3) evaluation, the at least one evaluation unit can relay an output value corresponding to the signal level of the response signal to a control device.

In another embodiment, if there are a plurality of recorded identical or similar response signals, the control device can take into account a geometrical arrangement of the sensor surfaces that have delivered the response signals, wherein it specifies the geometrically nearest sensor surface as that whose function an operator has intended.

In yet another embodiment, it is provided that a height of the signal level of the response signal of a respective sensor surface of a detector is previously assigned to an appurtenant actuation.

In series of experiments with the hand-held control according to the invention and the method according to the invention, it has surprisingly been found that as a result of the structure and the method, on the one hand the breakdown susceptibility of the capacitive detectors is reduced significantly and the reliability of the function is increased considerably.

BRIEF DESCRIPTION OF THE DRAWING

The invention is explained in detail with reference to the appended drawings. In the figures.

DETAILED DESCRIPTION OF PREFERRED EMBODIMENTS

The terms "top", "bottom", "left" and "right" each relate to the respective arrangements in the views of the figures.

Figure 1:
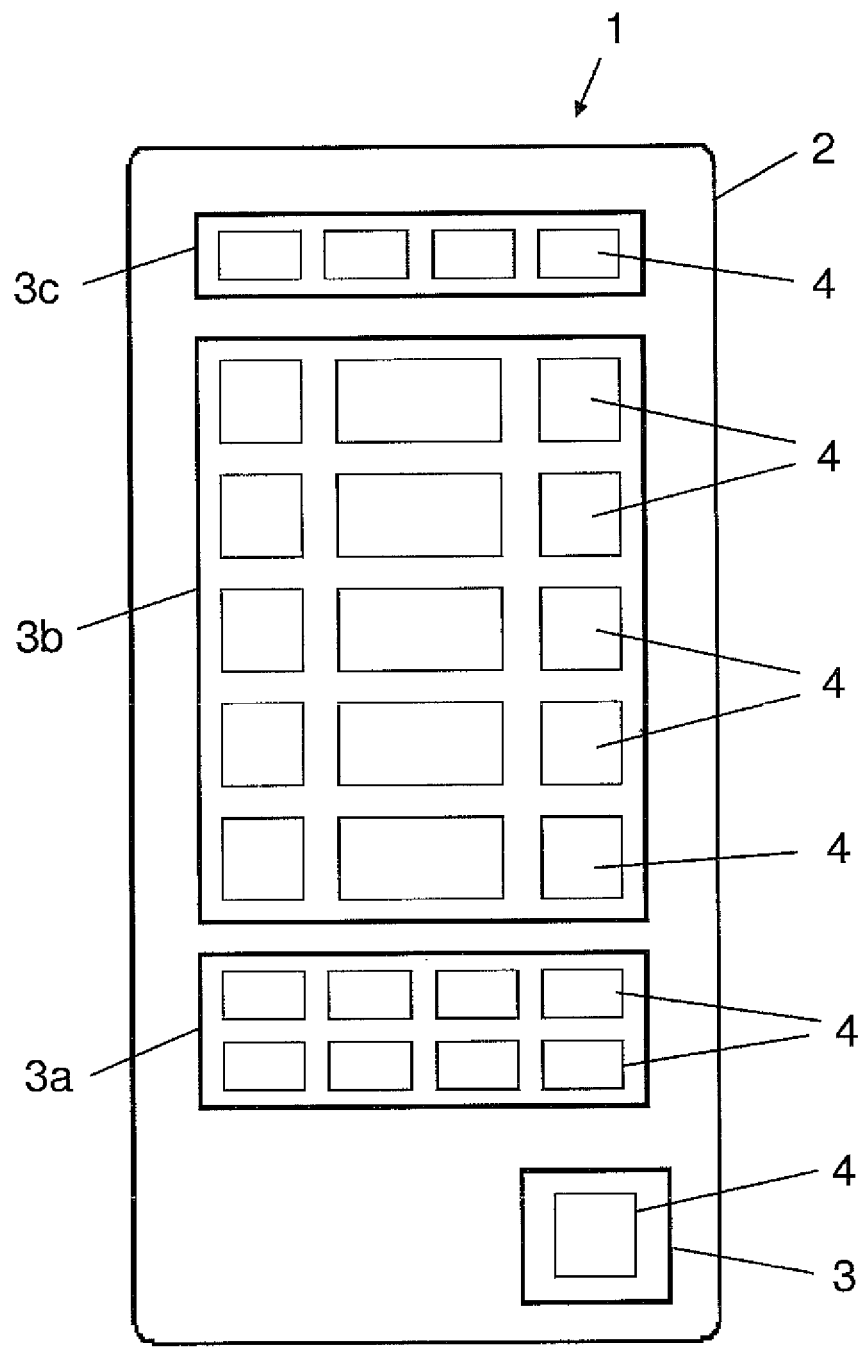
FIG. 1 shows a schematic plan view of a first exemplary embodiment of a hand-held control according to the invention.
Figure 2:
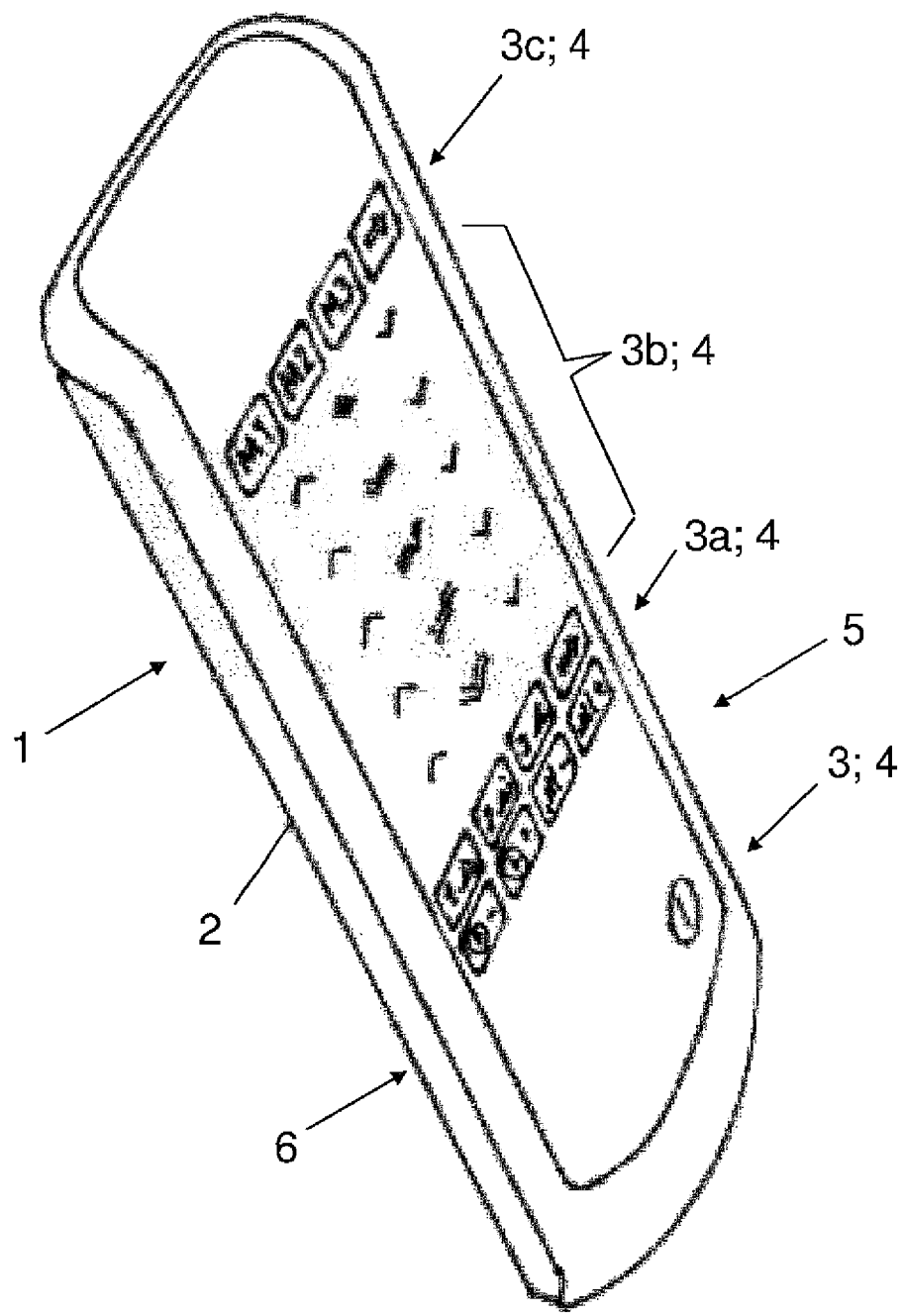
FIG. 2 shows a perspective, photorealistic view of the first exemplary embodiment according to FIG. 1.

FIG. 1 shows a schematic plan view of a first exemplary embodiment of a hand-held control 1 according to the invention. FIG. 2 shows a perspective photorealistic view of the first exemplary embodiment according to FIG. 1.

The hand-held control 1 has a housing 2 with a front side 5 and a rear side 6. The front side 5 is provided with a number of control panel sections 3, 3a, 3b, 3c. The small control panel section 3 has an actuation surface 4 and is used, for example, as a switch-on device. The other control panel sections 3a, 3b, 3c have a multiplicity of actuation surfaces 4 with different symbols for different operating functions.

The hand-held control 1 is fitted with an electrical power source that is located inside the housing 2. The electrical power source can be a battery, a rechargeable battery or a storage battery. The electrical power source can be replaceable, where a compartment that can be closed by a cover is provided for this, e.g. accessible from the rear side 6. It is also possible that the electrical power source in rechargeable configuration is enclosed in the housing 2, in which case it is only possible to change the same by means of a tool or by destroying the housing 2. A charging of the rechargeable electrical power source can be accomplished by a connection, e.g. a plug connection or by means of a wireless induction device.

Furthermore, the surface of the hand-held control 1 can have a number of electrically conducting touch contacts that are designed to receive and transmit electrical energy for charging the electrical power source located in the housing 2.

According to this first exemplary embodiment, individual actuation surfaces 4 are configured to be permeable to light and are configured to be translucent by means of a light source inside the housing 2. Alternatively, actuation surfaces on the outer side of the hand-held control have symbols or lettering glued or printed thereon or a tactile structure is provided on the surface, for example, in the form of Braille.

The actuation surfaces 4 act as button actuators, i.e. actuators of electrical buttons but the surface of the front side 5 of the entire control panel (all the control sections 3) is non-resilient and has no springy sections. The surface can, for example, be made of glass.

At this point, the springy resilience should be mentioned once again, which can be ascribed as a property itself to the material glass. Each material has a certain degree of springy, elastic or plastic resilience. In relation to the present invention, a certain degree of springy resilience is always given within the framework of a few tenths of millimetres, for example, of at least one tenth of a millimetre if finger pressure forces extend to the surface of the front side 5, which for example bring about finger pressure forces of more than 250 Newton on the front side outside the use of the hand-held control as intended.

In a first embodiment, each actuation surface 4 is assigned a detector 103 (see FIG. 8) that is disposed inside the housing 2 of the hand-held control 1. A detector 103 is to be understood in one embodiment as a detecting device that detects an approach or/and contact of a finger of a human hand in cooperation with the actuation surface and thereby outputs an electrical signal that is processed by an adjoining electronics, for example, of an evaluating unit and is provided for a transmission, e.g. to a control device of an electromotive furniture drive. This is explained in further detail below.

Figure 3:
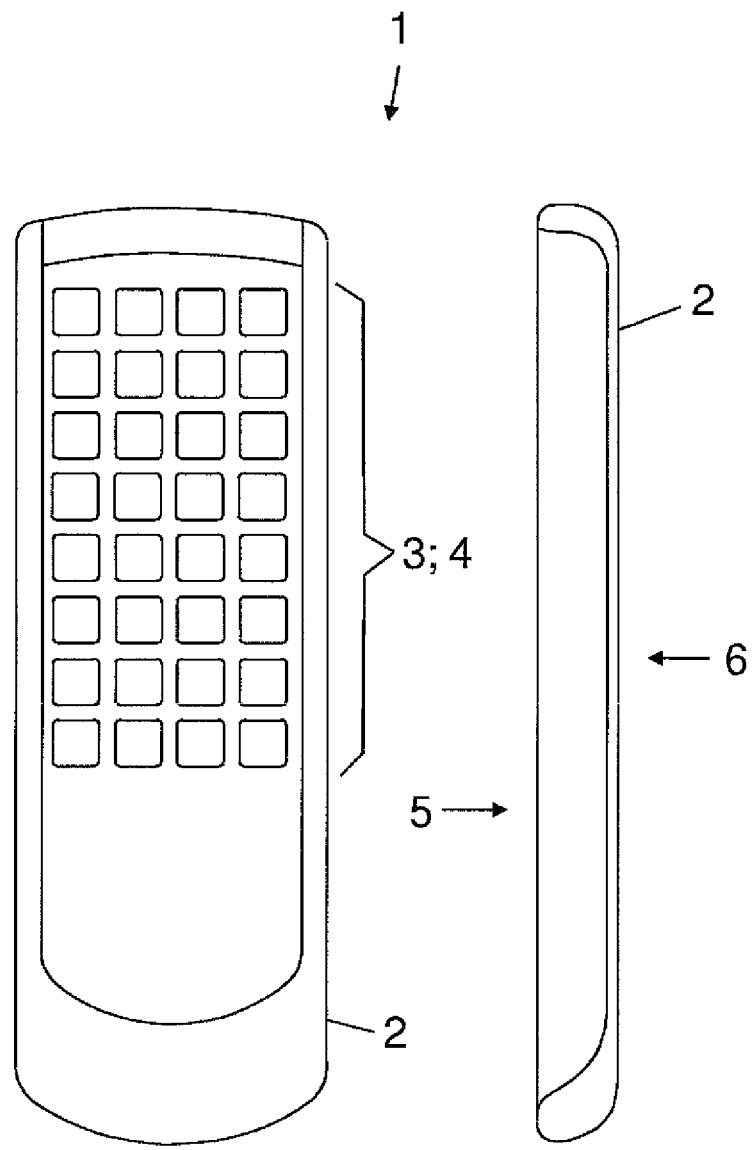
FIG. 3 shows photorealistic views of a variant of the first exemplary embodiment according to FIG. 1.

FIG. 3 shows photorealistic views of a variant of the first exemplary embodiment according to FIG. 1. The left side of FIG. 3 shows a plan view of the front side 5, the right side shows a side view.

In this variant only one control panel section 3 with thirty two (32) actuation surfaces 4 is provided. No symbols have yet been applied.

Figure 4:
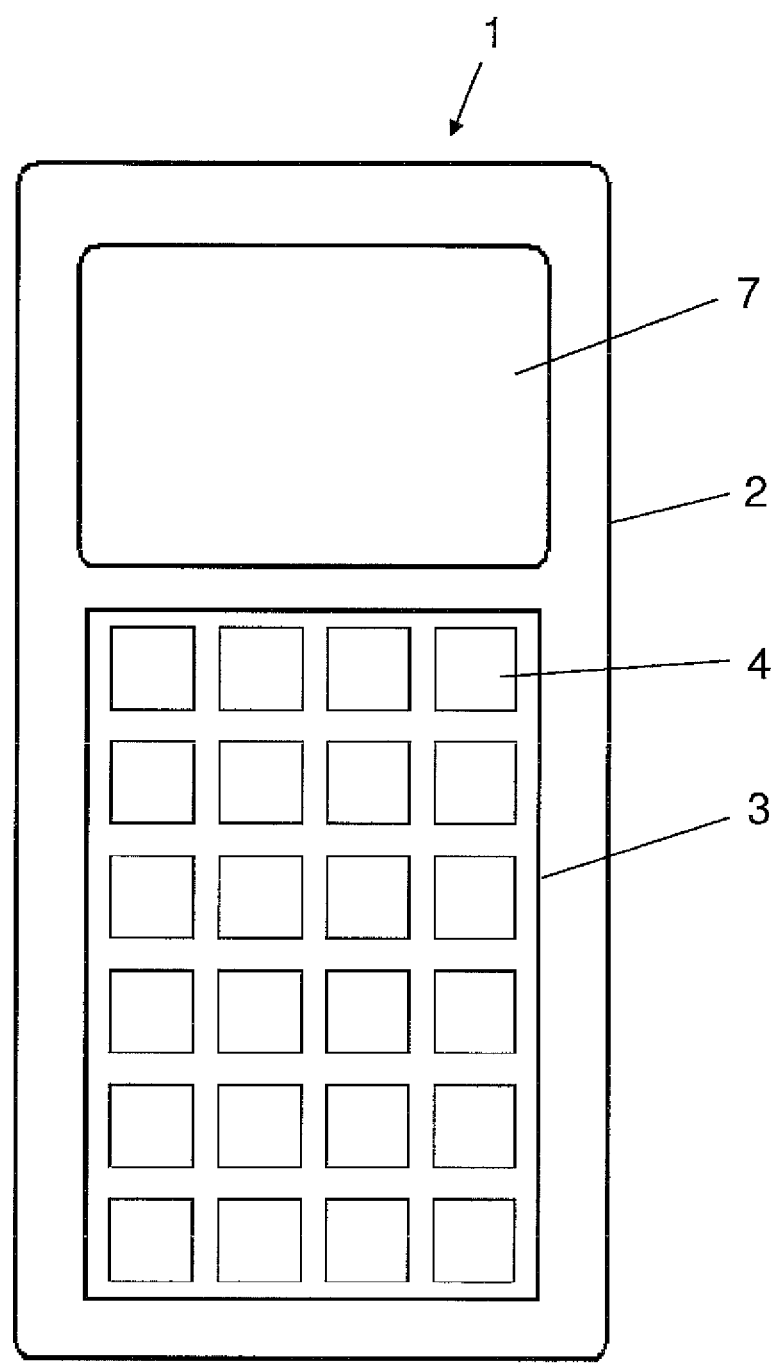
FIG. 4 shows a schematic plan view of a second exemplary embodiment of a hand-held control according to the invention.
Figure 5:
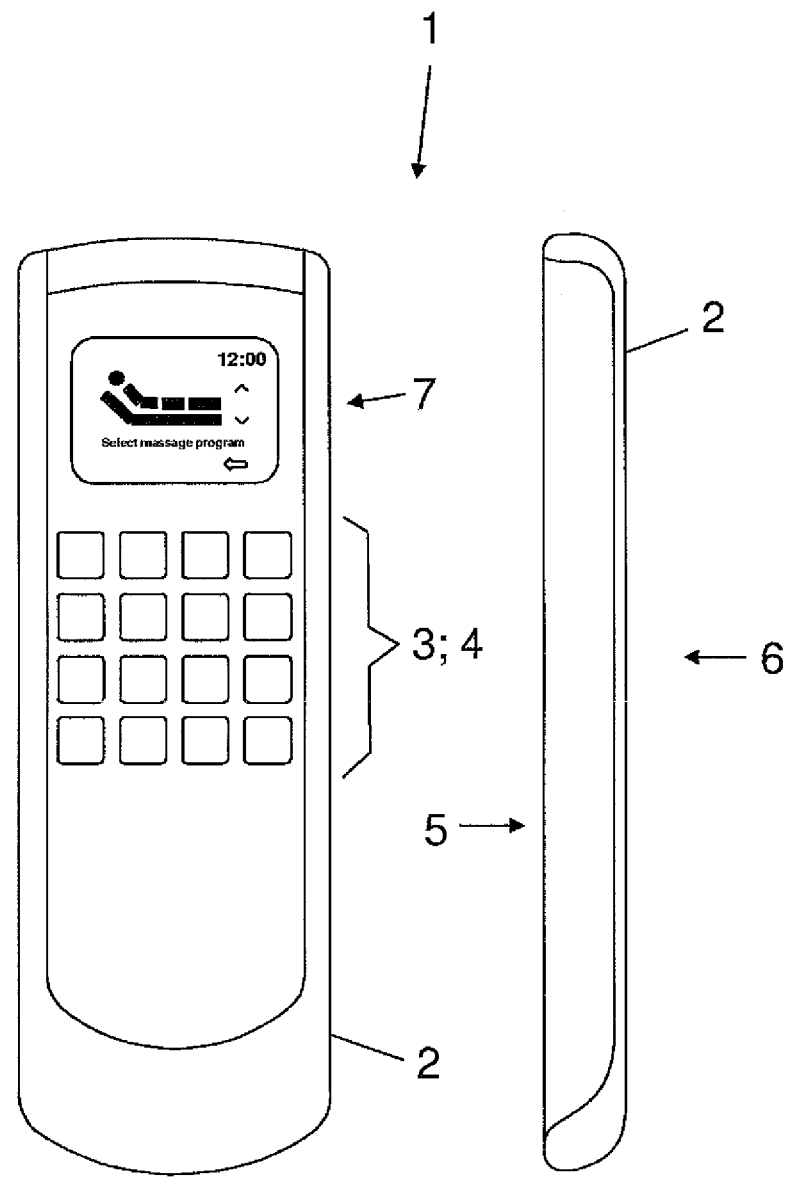
FIG. 5 shows photorealistic views of a variant of the second exemplary embodiment according to FIG. 4.

FIG. 4 shows a schematic plan view of a second exemplary embodiment of the hand-held control 1 according to the invention. FIG. 5 shows photorealistic views of a variant of the second exemplary embodiment according to FIG. 4.

The hand-held control 1 is constructed as described initially but additionally has a display device (display) 7. According to the embodiment of this FIG. 4, only one control panel section 3 is provided that has twenty four (24) or sixteen (16) actuation surfaces 4. Each actuation surface 4 is shown symbolically by a border. They are located at a predetermined distance from one another. This predetermined distance corresponds to the distance of the detectors 103 inside the housing 2 of the hand-held control 1.

It should also be noted that all the so-called borders of the actuation surfaces 4 shown in the figures should preferably be used for better illustration both of the size and of the arrangement of the actuation surfaces 4. The application or identification of the actuation surfaces 4 on or with the front side 5 is implemented according to the design of the hand-held control 1.

Figure 6:
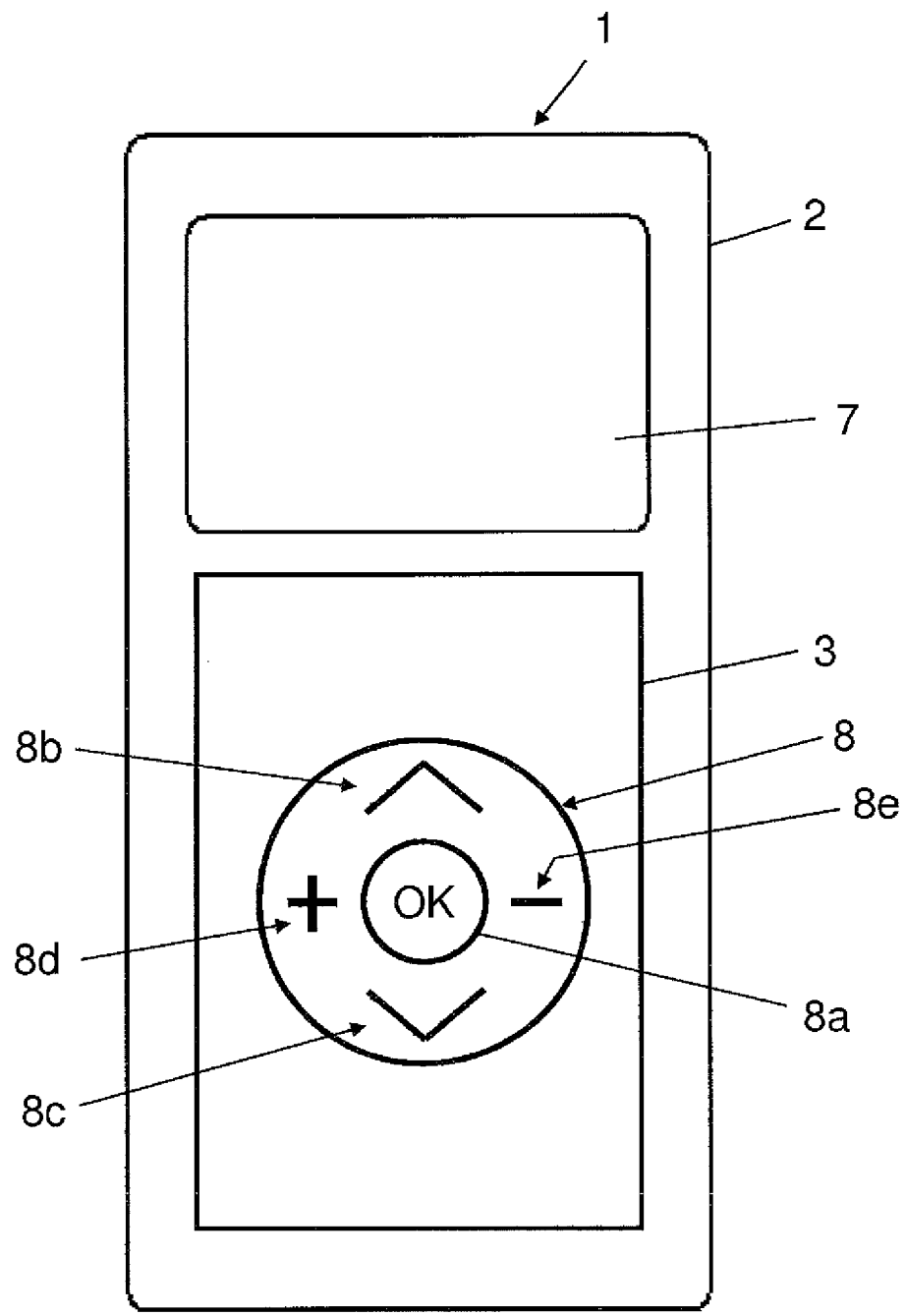
FIG. 6 shows a schematic plan view of a third exemplary embodiment of a hand-held control according to the invention.
Figure 7:
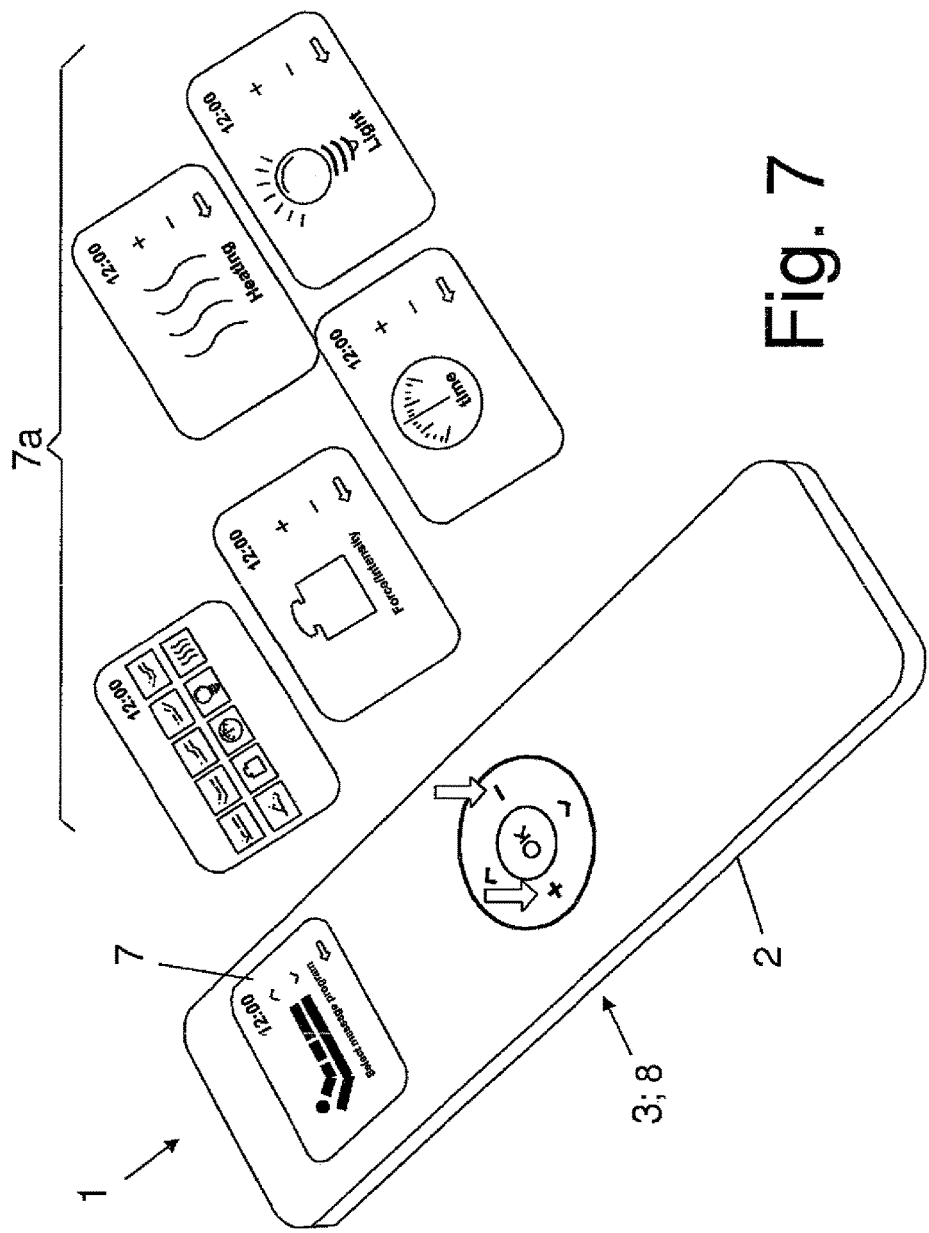
FIG. 7 shows a perspective, photorealistic view of the third exemplary embodiment according to FIG. 6.

FIG. 6 shows a schematic view of a third exemplary embodiment of the hand-held control 1 according to the invention; and FIG. 7 shows a perspective photorealistic view of the third exemplary embodiment according to FIG. 6.

FIG. 6 shows a hand-held control 1 with a display device 7 and a control panel section 3 consisting here of an exemplary circular actuation surface 8 with five individual separate actuation surfaces 8a . . . 8e. In this cases four actuation surfaces 8b, 8c, 8d, 8e are arranged at the same distance and in a circular shape around a central actuation surface 8a.

The function is as follows: the menu of the display device 7 can be switched over by means of two menu actuators 8c, 8d. Two further switching surfaces as function actuators 8b, 8c actuate the selected function. A predetermined switching surface as acknowledgement actuator 8a forms a logical selection and confirmation function of the operability of the hand-held control 1.

FIG. 7 furthermore shows exemplary display patterns 7a that can be depicted for operation and information by the display device 7.

A pocket torch function of the hand-held control 1 is not shown but can be easily visualized. To this end, e.g. a highly luminous light-emitting diode or a light-emitting diode array is provided that can be switched on and off by an actuation surface 4.

Figure 8:
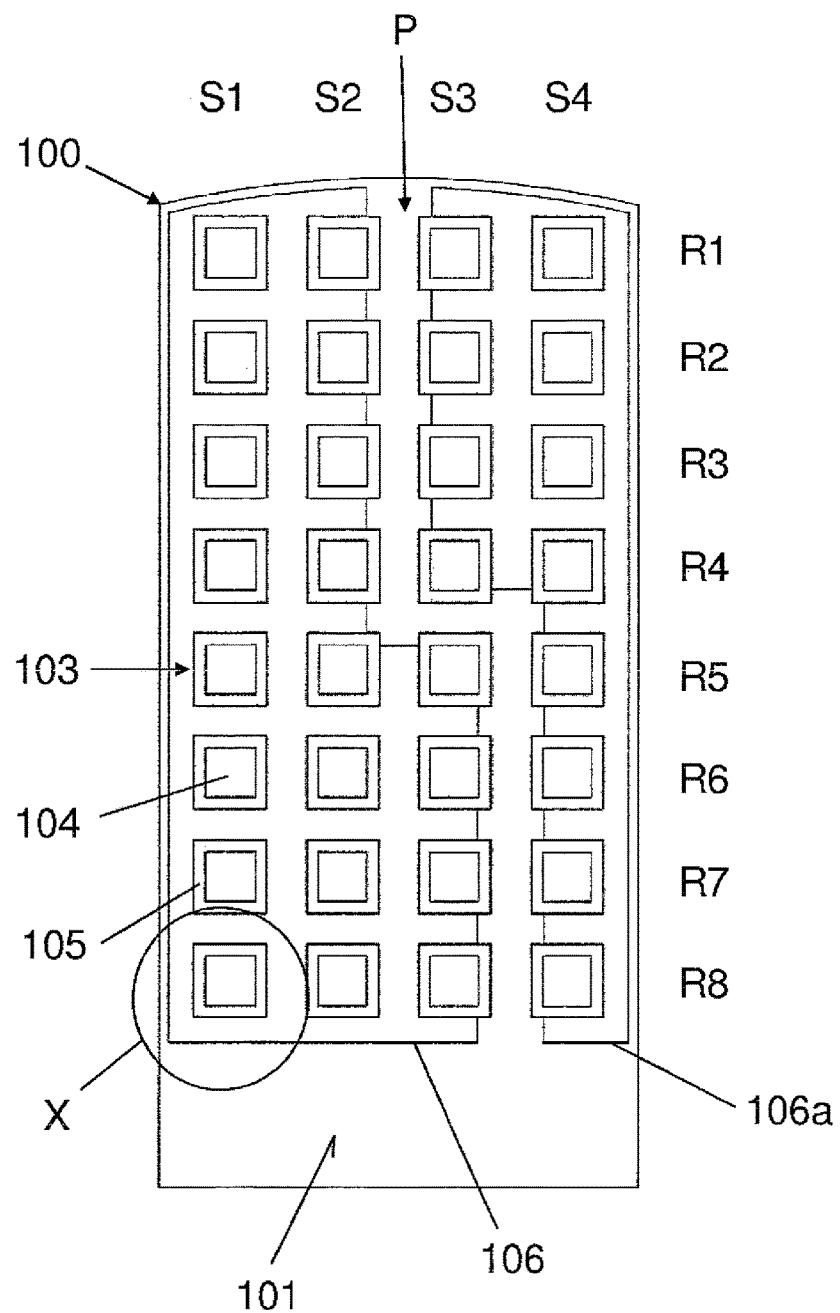
FIG. 8 shows a schematic plan view of an actuation side of a detector printed circuit board.
Figure 9:
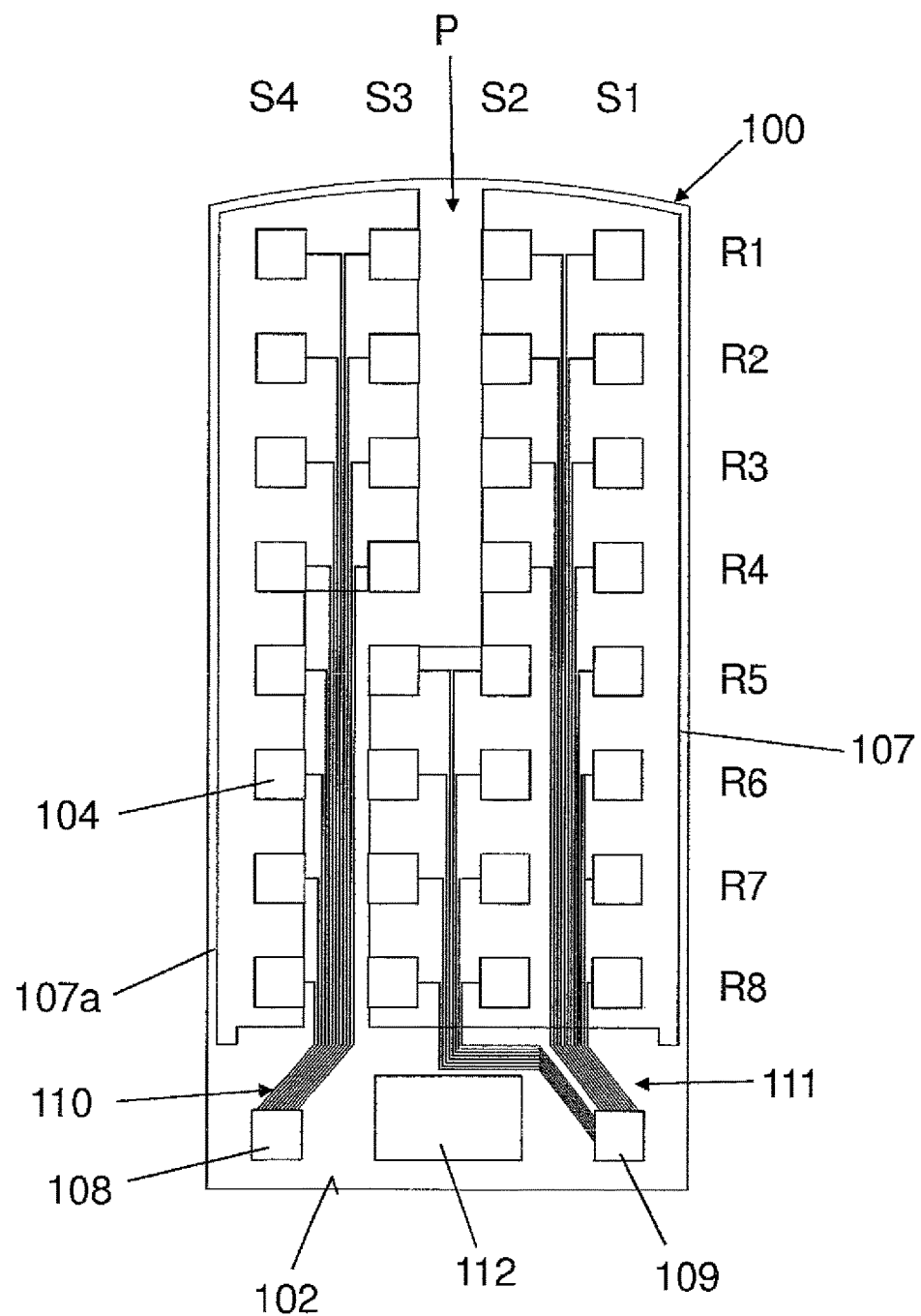
FIG. 9 shows a schematic view of a component side of the detector printed circuit board according to FIG. 8.

FIG. 8 shows a schematic plan view of an actuation side 101 of a detector printed circuit board 100. FIG. 9 shows a schematic plan view of a component side 102 of the detector printed circuit board 100 according to FIG. 8.

In this example, the detector printed circuit board 100 is a double-sided printed circuit board and comprises the detectors 103, ground planes 106-106a and 107-107a, detector conductor paths 110, 111 and at least one evaluating unit 108, 109.

The detectors 103 each have at least one sensor surface 105 and are arranged in rows and columns on the actuation side 101 of the detector printed circuit board 100. For better orientation the columns S1 . . . 4 are named from left to right and the rows R1 . . . 8 are named from top to bottom on the actuation side (FIG. 8).

Thirty two detectors 103 are provided here. Each sensor surface 105 is configured as a rectangular, in particular square, electrically conducting frame. In this case, each sensor surface 105 consists of a correspondingly shaped conductor path of the printed circuit board and is electrically connected to an evaluating unit 108, 109 via in each case one of the detector conductor paths 110, 111.

In this example, through holes 104 are formed in the sections enclosed by the surface surfaces 105. They will be explained in further detail below.

The sensor surfaces 105 are at least partially completely surrounded on the actuation side 101 by two ground planes 106 and 106a and electrically insulated from the ground planes 106 and 106a. In this case, here on the left side of the actuation side 101, the sensor surfaces 105 of the column S1, the lowest four sensor surfaces 105 of the rows R5-8 of the second column S2 and the sensor surfaces 105 of the rows R1-4 of the fourth column S4 are all completely surrounded by ground planes 106-106a, i.e. on all four sides. The sensor surfaces 105 of the rows R1-4 of the column S2, the rows R1-3 and R6-8 of the column S3 and the rows R5-8 of the column S4 are only surrounded by ground planes 106-106a on three sides while the sensor surfaces 105 of the rows R4-5 of the column S3 are only surrounded by ground planes 106-106a on two sides.

On the actuation side 101, the two ground planes 106 and 106a are arranged separated from one another by a path P.

The path P runs from the top initially between the sensor surfaces 105 of the columns S2 and S3 via the rows R4 vertically downwards. Then the path P runs at right angles to the right between the rows R4-5 as far as the column S4 and further at right angles downwards between the columns S3 and S4 via the rows R5-8.

The first ground plane 106 is here assigned twenty detectors 103 and the second ground plane 106a is linked to twelve detectors 103.

The detector printed circuit board 100 is arranged, e.g. glued with the actuation side 101 into a related housing 2 under the control panel sections 3 and operating surfaces 4 (see, e.g. FIG. 3).

Likewise, two ground planes 107 and 107a are arranged on the component side 102 in the same configuration, geometry and arrangement as on the actuation side 101. Here the first ground plane 107 of the component side 102 corresponds to the first ground plane 106 of the actuation side 101 and the second ground plane 107a of the component side 102 corresponds to the second ground plane 107a of the actuation side 101.

Figure 10:
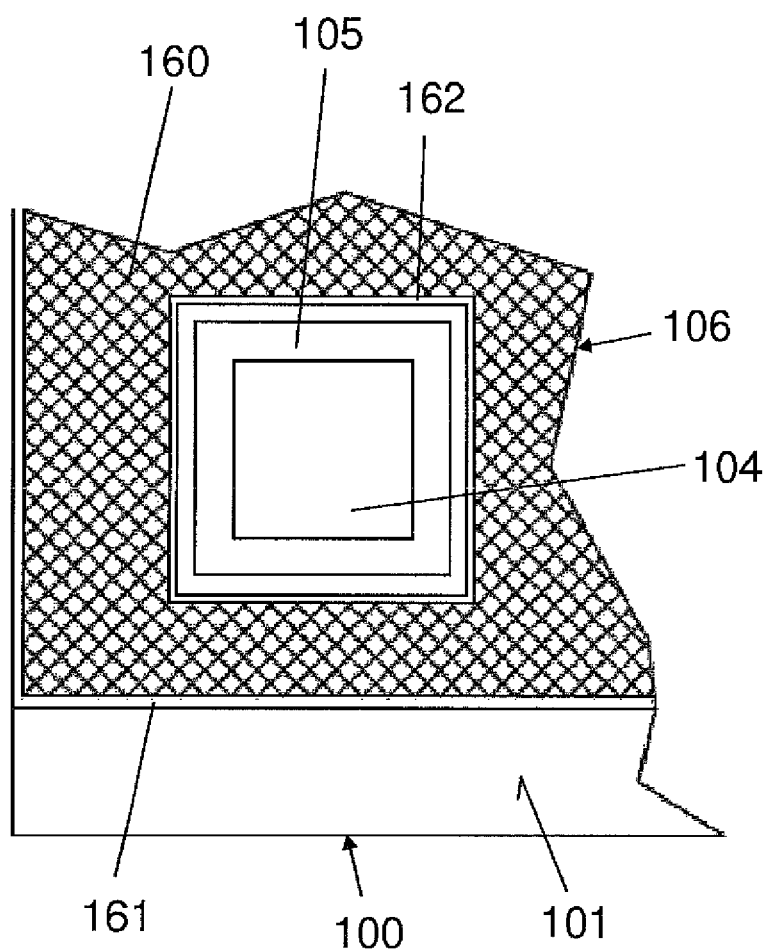
FIG. 10 shows an enlarged view of a section X of a ground plane according to FIG. 8.

In a special configuration, the ground planes 106-106a and 107-107a can be configured with a cross pattern 160 instead of with a continuous surface. This is shown schematically in FIG. 10 in an enlarged view of a section X of the ground plane 106 according to FIG. 8. The ground plane 106 is surrounded by an edge 161 with a further edge 162 surrounding the sensor surface 105.

Here two evaluating units 108 and 109 together with a connecting unit 112 are arranged on the component side 102 of the detector printed circuit board 100. The first evaluating unit 108 is here connected in an electrically conducting manner via twelve detector lines 110 to the twelve sensor surfaces 105 already mentioned above, while the second evaluating unit 109 is here connected in an electrically conducting manner by means of twenty detector lines 111 to the twenty sensor surfaces 105 already mentioned above.

The detector lines 110 are electrically insulated from the two ground planes 107 and 107a through which they run. Electrically conducting connections with the respective sensor surface 105 are here configured by means of corresponding vias of the detector printed circuit board 100.

Furthermore, a connecting unit 112 is provided on the component side 102 of the detector printed circuit board 100, which in FIG. 9 is arranged at the bottom between the evaluating units 108, 109 and is configured as a plug connection. An electrical connecting lead, not shown, connects the detector printed circuit board 100 to a control printed circuit board 200, where this connecting lead forms an electrically conducting connection with the connecting unit 112 of the detector printed circuit board 100 and a connecting unit 212 of the control printed circuit board 200.

Figure 11:
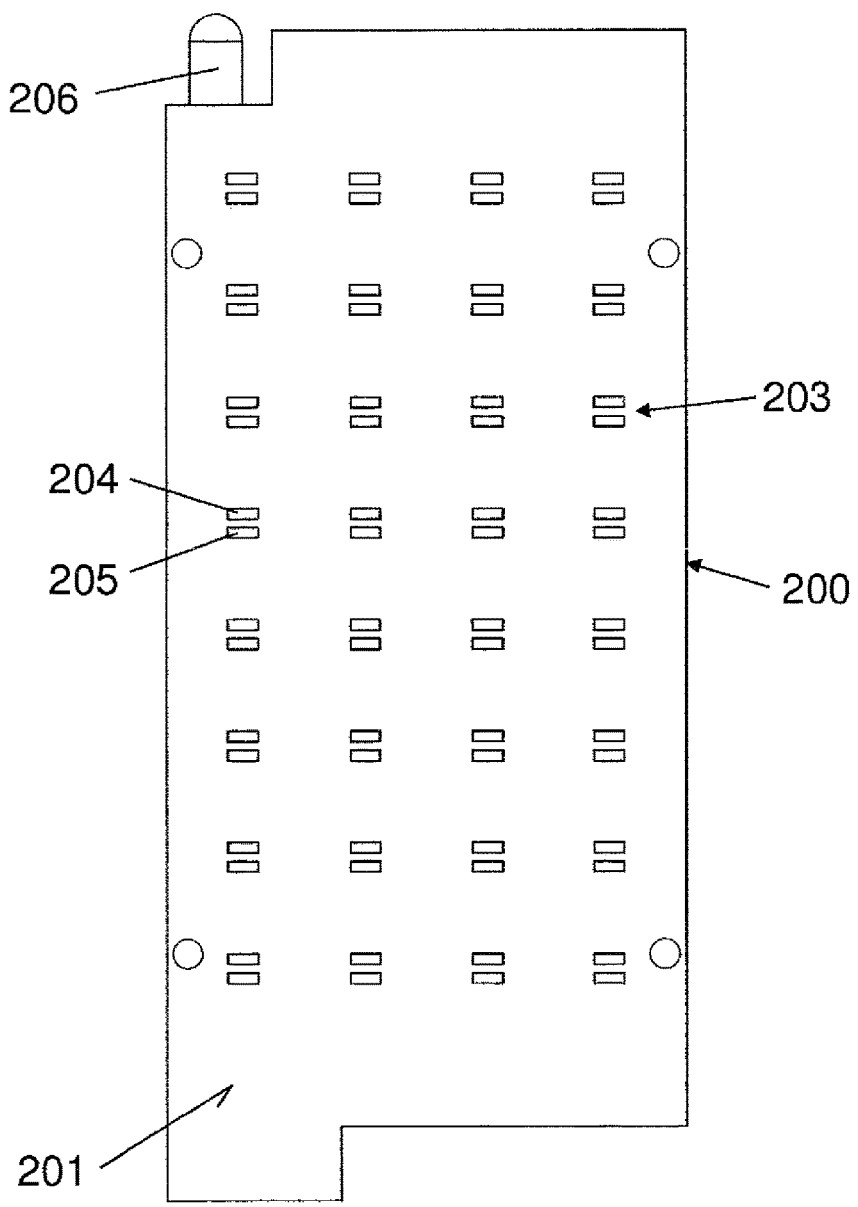
FIG. 11 shows a schematic plan view of an upper side of a control printed circuit board.
Figure 12:
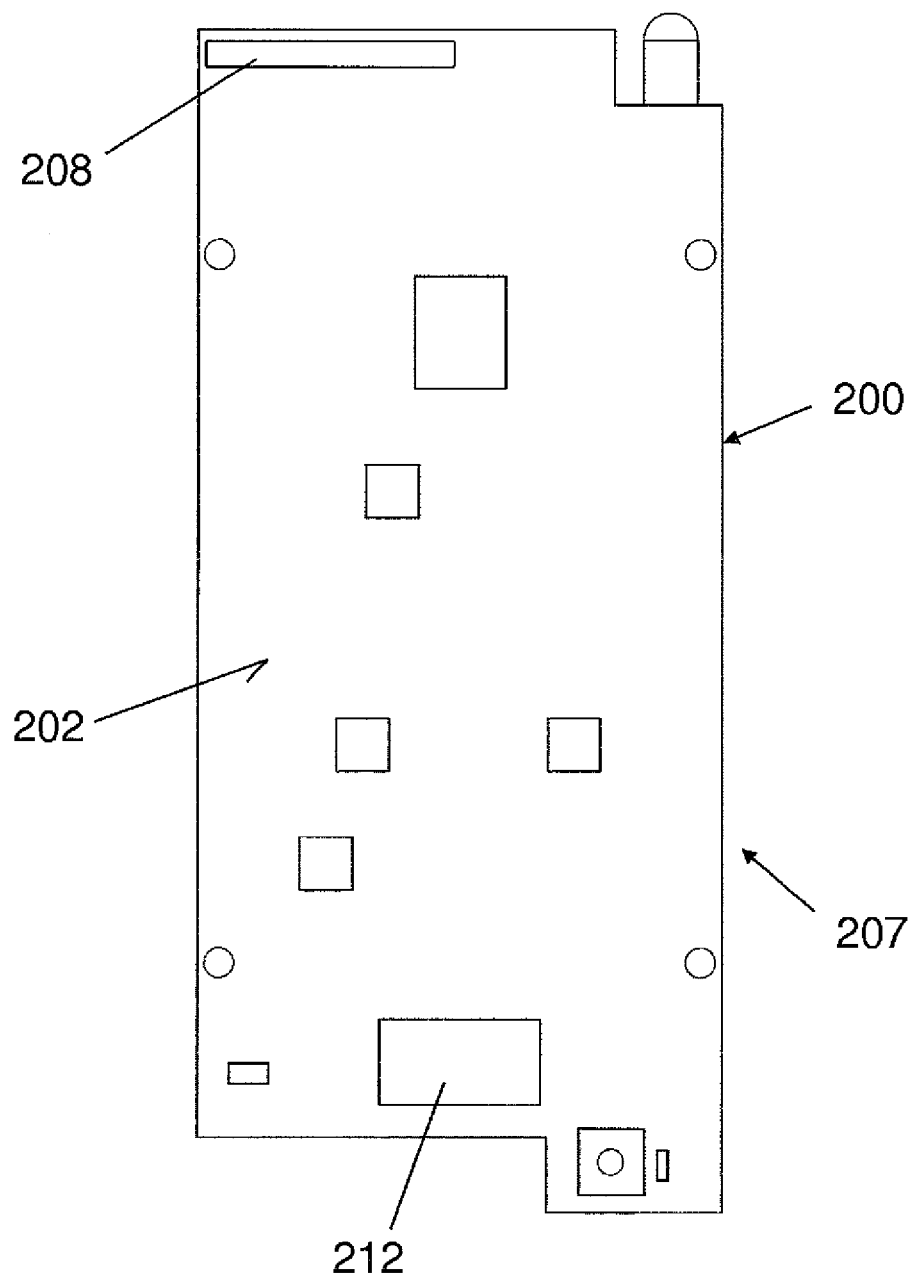
FIG. 12 shows a schematic view of a component side of the detector printed circuit board according to FIG. 10.

FIG. 11 shows a schematic plan view of the upper side 201 of a control printed circuit board 200. FIG. 12 shows a schematic plan view of a component side 202 of the control printed circuit board 200 according to FIG. 11.

The control printed circuit board 200 is a double-sided printed circuit board and comprises light units 203, a control device 207 and a connecting unit 212. As transmitting and receiving unit for communication with a control of an electromotive furniture drive, the control printed circuit board 200 can have a transmitting element 2006, e.g. for an infrared transmission path or/and an antenna 208 for a radio transmission path. A connection for a wired transmission path is also feasible. This naturally includes the required transmitting and receiving circuits for the various transmission paths.

The light units 203 are arranged on the upper side 201 of the control printed circuit board 200. The arrangement thereof is selected according to the arrangement of the detectors 103 on the detector printed circuit board 100. Each light unit 203 here comprises two light elements 204, 205, for example, light-emitting diodes (LED) with different colours. The control printed circuit board 200 is mounted at a certain distance from the detector printed circuit board 100 on this with corresponding spacers and fastening means. This is accomplished in such a manner that in each case a light unit 203 is located above or below a through hole 104 of the respectively appurtenant detector 103.

In this way, a symbol or an actuation surface 4 located above the respective detector 102 can be illuminated directly or indirectly by the appurtenant light unit 203 in order to show certain operating states of the appurtenant function or even only to form an illumination.

There are various possibilities here. Thus, for example, the first light element 204 as a single-coloured LED can form a base lighting and the second light element 205 can be used as acknowledgement of actuation. The base light is, for example, white. The second light element 205 can, for example, be a two-coloured LED, where two different actuation acknowledgement colours are possible, e.g. green or yellow as first colour and blue as second colour.

The two light elements 204 and 205 can be configured as a multi-coloured LED.

The first light elements 204 can be combined as groups.

The control device 207, the antenna 208 and the connecting unit 212 are arranged on the component side 202 of the control printed circuit board 200.

Figure 13:
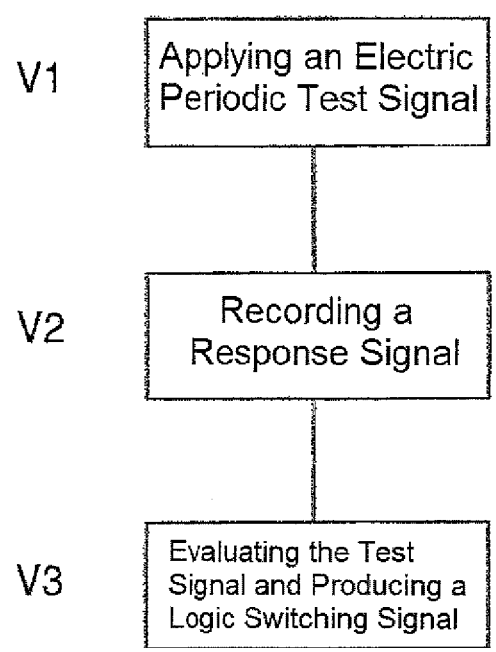
FIG. 13 shows a schematic flow diagram of a method according to the invention.

The function of the detectors 103 and the evaluation thereof will now be described in connection with FIG. 13. For this purpose, FIG. 13 shows a schematic flow diagram of a method according to the invention.

The ground planes 106-106a and 107-107a form a reference for the sensor surfaces 105, where a capacitance of the capacitors thus formed is varied by an actuation. This change in capacitance is detected by the evaluating unit 108, 109.

In a first process step V1, the sensor surfaces 105 of the detectors 103 are each acted upon by an electrical periodic test signal from the evaluating units 108, 109 via the detector conductor paths 110, 111. Such a test signal is applied by the evaluating units 108 109 in order to the sensor surfaces 105 of the detectors 103. Upon touching an actuation surface 4 above the appurtenant sensor surface 105 of the corresponding detector 103, the character of the appurtenant test signal changes, which is designated as a response signal. This is recorded by the appurtenant evaluating unit 108 109 in a second process step V2.

In this case, a capacitance change of about 1 pF due to touching of the actuation surface 4 can be detected physically by the evaluating unit 108, 109 as a response signal at the sensor surface 105, where an inherent capacitance of the detector conductor paths 110, 111 of about 1 pF/cm is disregarded by the evaluating units 108, 109 in a corresponding manner.

In a third process step V3, the respective response signal of a detector 103 is evaluated by the evaluating units 108, 109 and a corresponding logic switching signal is formed, which is then relayed to the control device 207. The control device 207 generates a corresponding function command signal for transmission via the transmission path to the associated electromotive furniture drive.

In the third process step V3 a logic switching signal is formed directly from the response signal.

In a second variant, the evaluating units 108, 109 jointly compare all the response signals, where the response signal with the highest signal level is used for relaying to the control device 207.

In a third variant, all the evaluating units 108, 109 relay an output value corresponding to the signal level of the response signal to the control device 207. The control device 207 then determines, which sensor surface 105 of a detector 103 belongs to this. If, for example, five sensor surfaces 105 deliver an identical or similar response signal, the geometrical arrangement of the sensor surfaces 105 of the detectors 103 is taken into account and the geometrically nearest sensor surface 105 is specified as that whose function an operator has intended. The control device 207 comprises at least one controller, e.g. a microcomputer with corresponding software.

Physical influences that can cause interference are suppressed by software and further measures. This is previously possible, for example, by various tests where it is specified for the first and second variant which height of the signal level of the response signal of a respective sensor surface 105 of a detector 103 corresponds to a related actuation. Various calibrating or adjusting routines of the software of the control device 207 can be used for this purpose.

In addition, a self-calibration of the evaluating unit 108, 109 can be made. In this case, the active sensor surface 105 is determined by means of various multiple sequences. This process can naturally also be self-learning.

It has surprisingly been shown that a satisfactory operating function is made possible in this way.

A hand-held control 1 according to the invention can be used together with an electromotive furniture drive for adjustment of the components of an item of furniture to be adjusted, where the hand-held control 1 is provided for operation of the adjustment functions and possible further functions of the electromotive furniture drive.

Figure 14:
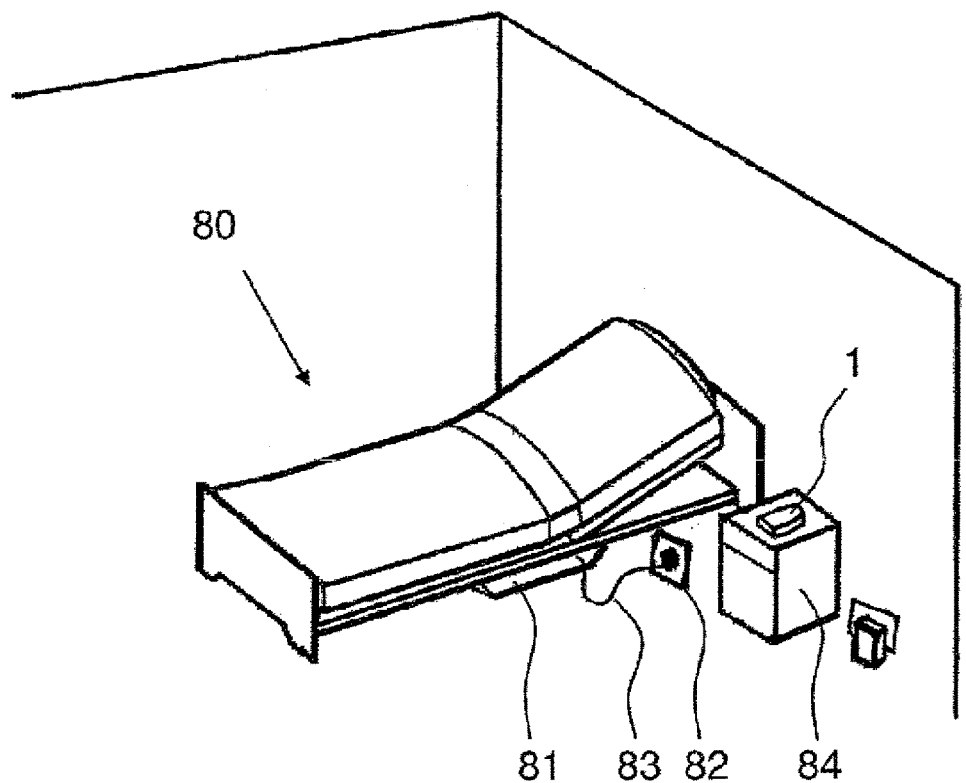
FIG. 14 shows a schematic perspective view of an exemplary embodiment of a hand-held control with an exemplary item of furniture.

FIG. 14 shows a schematic perspective view of an exemplary embodiment of a hand-held control 1 with an exemplary item of furniture 80, which is here configured as a bed. The furniture 80 comprises an electromotive furniture drive 81 that is connected to the furniture 80 and adjusts by motor movable furniture components of the furniture 80. In this case the at least one furniture drive 81 comprises a driven member operated by an electric motor that is in mechanical operative communication indirectly or directly with movable or alternatively with fixed furniture components via functional fittings and moves the respective furniture component relative to another furniture component at least during operation of the respective electric motor.

According to the diagram in FIG. 8, the back part of the furniture 80 configured as a bed is adjusted somewhat upwards from the base position. Here a mains connection 82 on the building side is provided for the power supply of the furniture drive 81.

The furniture drive 81 is supplied with electrical power from the electrical mains via the mains connection 82 via a lead 83. Alternatively, the furniture drive 81 can also comprise a mains-independent power supply in the form of a storage battery.

Furthermore, the hand-held control 1 is provided for operation of the furniture drive 81 and is placed for example on a shelf 84 until it is further used by a user. In this design hand-held control 1 and furniture drive 81 are configured for wireless communication between one another. To this end, the hand-held control 1 has at least one transmitting device whilst the furniture drive 81 comprises a receiving device. Alternatively, hand-held control 1 and furniture drive 81 each comprise a transmitting device and a receiving device when they are in communication with one another in a wireless and bidirectional transmission path. A first transmitting device is formed by a radio-wave-transmitting radio transmission device. Another transmitting device is formed by a light-wave-transmitting infrared light transmitting device.

The invention is not restricted by the exemplary embodiments described above but can be modified within the framework of the appended claims.

The detector printed circuit board 100 can also be designed for other numbers of detectors 103, e.g. for twenty detectors 103. In this case, for example, only the second evaluating unit 109 is required.

Instead of a cross pattern of the ground planes 106-106aa and 107-107a, these can also be provided with a different pattern. In addition, it is possible that the ground planes 106-106a and 107-107a are only partially provided with a pattern and otherwise are configured to be continuously flat.

The detector printed circuit board 100 and the control printed circuit board 200 can naturally also be configured as multilayer printed circuit boards.

It is naturally also feasible that the detector printed circuit board 100 and the control printed circuit board 200 form a common printed circuit board where the components of the detector printed circuit board 100 and the control printed circuit board 200 are arranged on the common printed circuit board.

Furthermore, in the case of more than at least two printed circuit boards, e.g. detector printed circuit board 100, control printed circuit boards 200 or/and a lighting printed circuit board (not shown), it is possible that these printed circuit boards are electrically and also mechanically connected to one another via plug connectors, stack bars or the like.

The light units 203 can also be arranged on the sensor printed circuit board 100. A combination of the arrangement on the sensor printed circuit board 100 and the control printed circuit board 200 is also feasible.

The sensor surface 105 can also be an open frame. The shape of the sensor surface 105 can also be circular, oval, angular or consist of combinations thereof.

What is claimed is:

1. A method for detecting an actuation of a hand-held control for an electromotive furniture drive, wherein the hand-held control has at least one detector, comprising the steps of:
    applying an electric periodic test signal from at least one evaluation unit to at least one sensor surface of at least one detector via detector conductor paths, wherein the at least one evaluation unit is connected to the at least one detector in an electrically conducting manner;
    recording a response signal by means of a test signal modified by actuation of the at least one detector;
    evaluating the test signal thus obtained using the at least one evaluation unit and producing a logic switching signal for detecting the actuation of the hand-held control,
    wherein a height of a signal level of the response signal of the sensor surface of the detector is previously assigned to a related actuation.

2. The method of claim 1, wherein the logic switching signal is formed directly from the response signal.

3. The method of claim 1, wherein the at least one evaluation unit compares in the evaluating step all response signals, with the one of the response signals having a highest signal level being used for relaying to a control device of the hand-held control.

4. The method of claim 1, wherein the at least one evaluation unit relays in the evaluating step an output value corresponding to a signal level of the response signal to a control device.

5. The method of claim 4, wherein in the presence of a plurality of recorded identical or similar response signals, the control device takes into account a geometrical arrangement of the sensor surfaces that have delivered the response signals, with the control device specifying a geometrically nearest sensor surface as the one whose function an operator has intended.

6. An electromotive furniture drive for adjustment of a movable component of an item of furniture, said electromotive furniture drive comprising at least one hand-held control which includes at least one detector, and at least one control panel section having at least one actuation surface which cooperates with the at least one detector, and which is detected by applying an electric periodic test signal from at least one evaluation unit to at least one sensor surface of at least one detector, recording a response signal by means of a test signal modified by actuation of the at least one detector, evaluating the test signal thus obtained and producing a logic switching signal for detecting the actuation of the hand-held control, wherein a height of a signal level of the response signal of the sensor surface of the detector is previously assigned to a related actuation.

\* \* \* \* \*